Sept. 14, 1965 T. D. SMITH 3,205,720

TELEVISION TUNER

Filed Feb. 10, 1964 3 Sheets-Sheet 1

INVENTOR.
THEODORE D. SMITH
BY Eugene M. Whitacre
Attorney

TELEVISION TUNER

Filed Feb. 10, 1964 3 Sheets-Sheet 2

INVENTOR.
THEODORE D. SMITH
BY
Eugene M. Whitacre
Attorney

Sept. 14, 1965 T. D. SMITH 3,205,720

TELEVISION TUNER

Filed Feb. 10, 1964 3 Sheets-Sheet 3

INVENTOR.
THEODORE D. SMITH
BY
Eugene M. Whitacre
Attorney

United States Patent Office 3,205,720
Patented Sept. 14, 1965

3,205,720
TELEVISION TUNER
Theodore D. Smith, Indianapolis, Ind., assignor to Radio Corporation of America, a corporation of Delaware
Filed Feb. 10, 1964, Ser. No. 343,725
21 Claims. (Cl. 74—10.8)

The present invention relates to tuning mechanisms and more particularly to step-by-step preset tuning mechanisms for ultra high frequency tuners.

Present authorization for the transmission of television signals includes 12 channels in the very high frequency (VHF) band and 70 channels in the ultra high frequency (UHF) band. Many receivers manufactured for home use include step-by-step tuning of the VHF television channels, and continuous tuning of the UHF channels. With increased numbers of UHF stations, it is desirable, from the consumers' and the broadcaster' points of view, to provide the same general type of tuning operation for UHF channels as for the VHF channels and thereby facilitate UHF channel selection. However, a step-by-step tuning of the 70 UHF channels does not present a convenient solution to this problem.

Furthermore, in order to receive UHF color signals with a step-by-step tuner, resettability becomes a greater problem. For acceptable color reception, a step-by-step tuner should be resettable to within about ±100 kilocycles (kc.) of a given frequency. Any further deviation in resettability will result in color video degradation requiring an additional manual adjustment to retune to the desired station.

It is an object of this invention to provide an improved preset television tuner mechanism.

It is a further object of this invention to provide an improved step-by-step ultra high frequency preset television tuner mechanism.

It is also an object of this invention to provide an improvide step-by-step ultra high frequency preset television tuner mechanism capable of tuning to any station in the ultra high frequency band.

It is also a further object of this invention to provide an improved step-by-step ultra high frequency television tuner mechanism capable of accurate resettability to selected television channels without further adjustment.

It may be assumed that the useable UHF signals in any given location will be separated by a predetermined number of channels. For example, it may be presumed that in any given area serviced by more than one UHF station, the channel allocations will be separated by at least three channels. In such a case, the UHF tuner may, for example, be provided with twenty-four spaced detent positions, each of which is capable of receiving three different UHF channels except for two of the positions which would receive two UHF channels. A preset tuning mechanism may then be provided to select a given one of the channels in any one of the detent positions.

In accordance with the invention, a detented rotary turret is provided with a plurality of adjustable control elements equally spaced about its periphery. As this rotary turret is rotated through its plurality of detent positions, the control elements make successive contact with a lever or follower. The rotation of the turret and the motion of the lever are then coupled to a common gearing means, which may, for example, comprise a differential gearing system, the output of which is connected to a continuously tunable UHF television tuner.

The adjustable control elements are adjusted to tune to the desired one of the plurality of channels available at the particular detent setting of the rotary tuner. The motion of the adjustable control element is transmitted through the lever and associated coupling gearing means to rotate the UHF tuner control shaft to the desired position. The tuner is thereby preset to tune to the same station each time the rotary turret is returned to that particular detent position.

A feature of the invention comprises the addition of an anti-backlash mechanism acting upon the tuner control shaft in opposition to the thrust of the coupling gearing means to improve resettability by minimizing lateral bearing pressure on the control shaft and taking up the system gearing slack.

The invention will further be understood from the following description considered in connection with the accompanying drawings.

Figure 2:
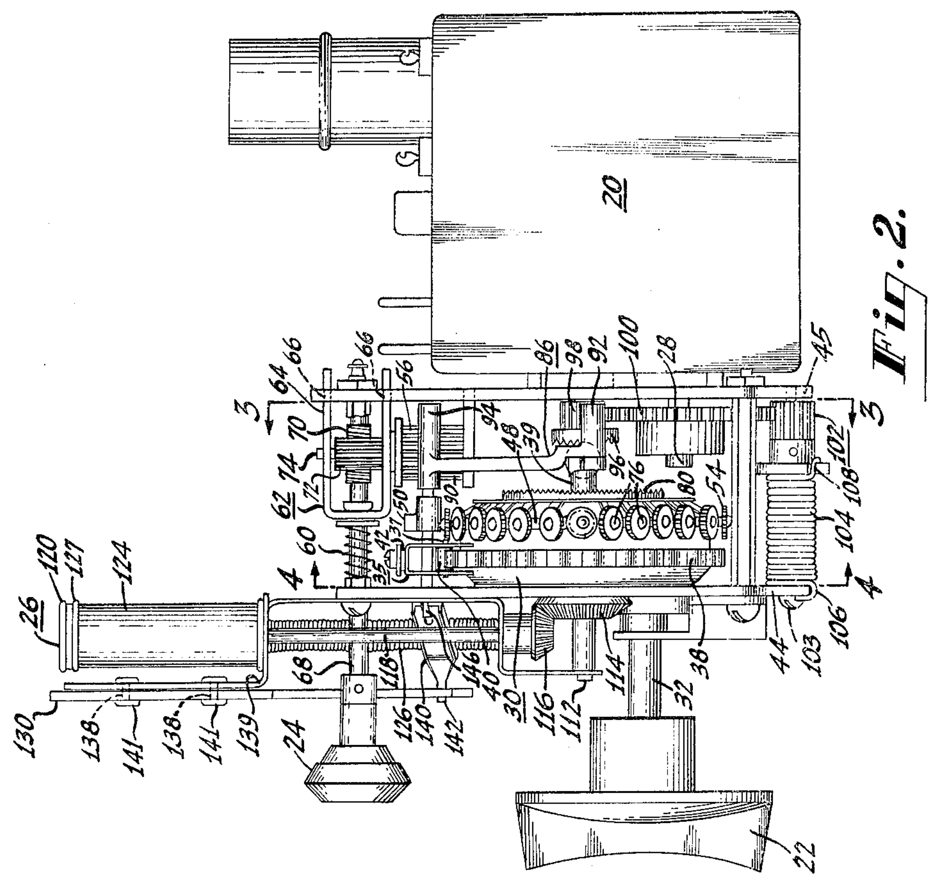
FIGURE 2 is a side view of the preset tuning mechanism and channel indication therefor of FIGURE 1.

Referring to the drawings, wherein the like elements and parts are designated by the like reference characters throughout the various figures, and referring particularly to FIGURE 2, it will be seen that the tuning mechanism includes an ultra high frequency tuner 20 suitably mounted for operation by a control knob 22 and a preset tuning knob 24. The tuner 20 is of the type which covers the entire UHF television band for 180° of the rotation of a tuner shaft 28.

The tuner 20 is rough tuned to a portion of the band in which the desired channel is located by turning control knob 22 and observing the channel indicator assembly 26.

Figure 4:
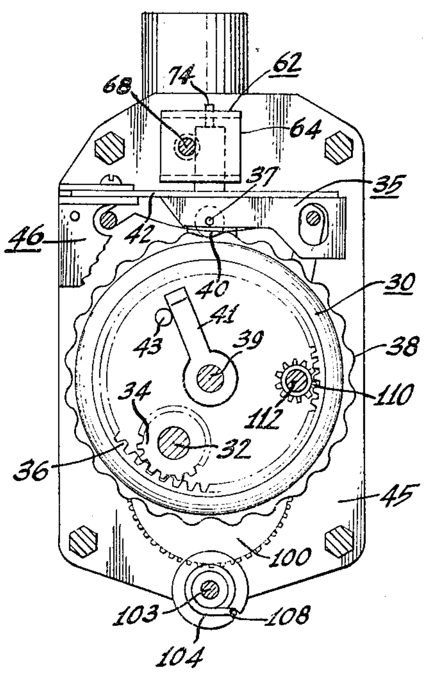
FIGURE 4 is a sectional view of the tuning mechanism taken on section lines 4—4 of FIGURE 2.

The knob 22 rotates a rotary turret 30 in the present example through a 3-to-1 step-down gear ratio. As seen in FIGURE 4, a shaft 32, on which the knob 22 is mounted, rotates a pinion gear 34 whicn, in turn, is coupled to mesh with a ring gear 36 which comprises an integral part of the turret 30. Three complete rotations of the knob 22 rotates the turret 30 through one revolution.

The turret 30 is mounted to rotate about a shaft 39 which extends between a pair of mounting brackets 44 and 45. Also mounted for rotation about the shaft 39 is a rotational limit cam 41 (FIGURE 4). The cam 41 limits the rotation of the turet 30 in both directions by engaging a pin 43 which rotates with the turret. The cam 41 includes a tab which exends forwardly, as viewed in FIGURE 1, through a window or slot 47 in the front mounting bracket 44. The pressure of the pin 43 forces the cam 41 against its stop in the window 47 (FIGURE 1) preventing any further rotation in that direction.

The rotary turret 30 is detented for twenty-four equally spaced stop positions by the detent notches 38 provided over 360° of the periphery of the turret. However, a different number of detent positions may be provided if desired. With twenty-four detent stop positions for the rotary turret 30, each detent position permits the coverage of three channels except for the two detent positions on the extreme limits of rotation of the rotary turret, which cover two channels. A detent spring 42 is permanently mounted on the mounting bracket 44 through a support means 46. The detent spring 42 carries a detent assembly 35 on which a detent roller 40 bearing is mounted to rotate about a detent assembly pin 37. The spring pressure of detent spring 42 causes the detent roller 40 to bear against the detent notches 38 to resiliently stop and hold the rotary turret 30 in any one of the twenty-four detent stop positions.

The rotary turret 30 also carries twenty-four equally spaced adjustable control elements or screws 48 (FIGURES 2, 3 and 5) extending radially from the periphery thereof as a means to provide a preset tuning arrangement at each detent position. The heads 54 of the tuning screws 48 are pinion gears which when turned move the screws 48 radially in or out of the turret.

Figure 3:
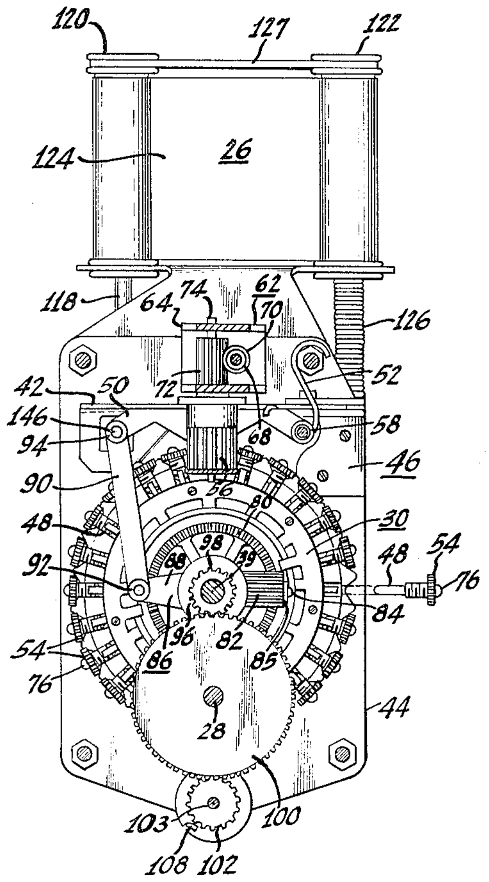
FIGURE 3 is a sectional view of the tuning mechanism taken on section lines 3—3 of FIGURE 2.
Figure 5:
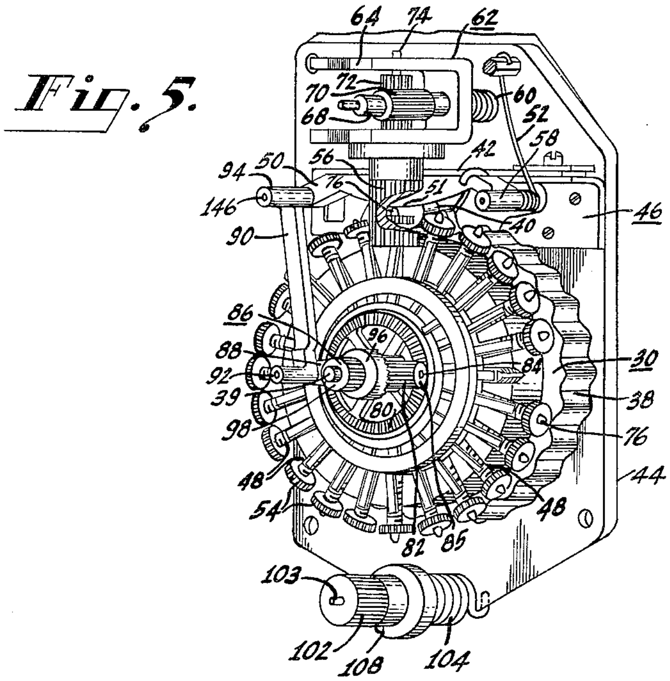
FIGURE 5 is a perspective sectional view of the tuning mechanism taken along section lines 3—3 of FIGURE 2 and showing the differential gearing, adjustable control elements and associated lever means.

A channel preset tuning assembly 62 adjusts the settings of the tuning screws 48. The assembly is moved into the tuning position by pulling out on the knob 24 against the force of a spring 60, wherein a U-shaped frame 64 slides along the slots 66 until a gear 56 meshes with a pinion gear head 54 (FIGURES 2, 3 and 5). By simultaneously pulling outward and rotating the knob 24, the attached shaft 68 rotates a worm gear 70, which in turn, rotates a pinion gear 72, thereby rotating the tuning gear 56 through an attached shaft 74. In this position, the tuning gear 56 will mesh with one of the tuning screw pinion gear heads 54 and thereby moves the tuning screws 48 in or out depending upon the direction of rotation of the knob 24.

As shown in FIGURE 3, each of the tuning screws 48 (shown in exploded fashion) includes a rounded tip or cap 76. As shown in FIGURE 5, as the turret 30 is rotated through its various detent positions, the tips 76 of the tuning screws successively come into contact with a point 51 of a pivotally mounted tuning lever arm 50. The lever arm 50 is spring biased by a spring 52 to come into contact with the tuning screw tips 76 as they successively rotate into position. By rotating the tuning screws 48 in or out, the movement of the screws, through the contact point 51, pivots the lever 50 about its fulcrum 58.

Figure 8:
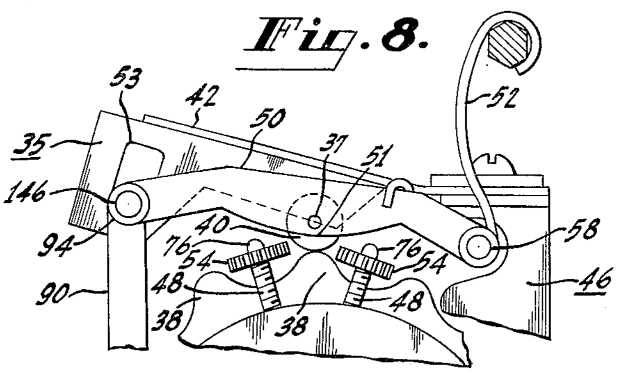
FIGURE 8 is an enlarged view of the detent and preset mechanism of FIGURES 1–5.

In FIGURE 8 the detent assembly 35 is shown serving an additional function by disengaging lever arm 50 from its contact position with the tuning screw tips 76, as the turrent 30 is rotated from one detent position to the next. A shaft 146 in a bearing 94 on the tuning lever arm 50 extends into the plane of the drawing through an oblong shaped slot 53 in the detent assembly. The slot 53 is made sufficiently long vertically to allow the tuning lever arm 50 to move the attached shaft 146 through the tuning range at any detent position without being obstructed. As the turret 30 is switched from one detent position to the next, the roller 40 follows the contour of the detent notches 38. As the roller moves from a nadir position towards a crest, its vertical motion is transmitted to the detent assembly 35 against the bias of the attached detent spring 42. When the roller 40 progresses sufficiently out of the notch, detent assembly slot 53 engages the lever shaft 146 and carries the lever shaft vertically along with it, thereby causing the attached lever arm 50 to rotate about its fulcrum 58. The action of the detent assembly 35 will raise the contact point 51 on lever arm 50 beyond the range of the tuning screw tips 76 as they rotate along with the turret 30, and then will subsequently lower the lever arm 50 back into contact position as the next detent position is approached. By disengaging lever arm 50 during the detent switching operation, the lateral motion of contact point 51 on the screw tips 76 is reduced thereby minimizing the wear upon the associated parts due to sliding friction. Furthermore, disengagement of the lever arm 50, prevents any false detenting of the mechanism by lever arm 50 and two adjacent tuning screws 48.

The motion of the lever arm 50 and rotation of turret 30 is transmitted to the tuner shaft 28 through a differential stepdown gearing mechanism. The differential gearing mechanism comprises of an input crown gear 80, a common differential gear 82 and a differential output gear 96.

The input crown gear 80 (FIGURES 3 and 5) comprises an integral part of the turret 30 and rotates with the turret concentrically about the axis of the turret mounting shaft 39. The teeth on the crown gear 80 face perpendicular to the plane of rotation of the turret 30 extending toward the tuner 20.

The differential output gear 96 is also freely mounted to rotate about the turrent mounting shaft 39. The teeth of the output gear 96 face perpendicular to the place of rotation of the gear (and also perpendicular to the plane of rotation of the turret 30), away from the tuner 20 and toward the turret 30.

Mounted between the input crown gear 80 and the differential output gear 96 and meshing with both gears is the common differential gear 82. The common differential gear 82 is mounted to rotate about a shaft 84 while held in place with a C ring 85. The shaft 84 is in turn, a part of a rotatable lever means 86. As shown in FIGURES 3 and 5, the rotatable lever means 86 is bearing mounted to rotate about the turret mounting shaft 39 forming a fulcrum joint. Extending in opposite directions and perpendicular to the axis of the mounting shaft 39 as part of the lever means 86 are two lever arms, one being the gear mounting shaft 84 and the other an actuating lever arm 88. The purpose of the rotatable lever means 86 is to couple the motion of the tuning lever arm 50 into the differential gearing mechanism. This is done through the use of a connecting rod 90 bearing mounted between the tuning lever arm 50 and the actuating lever arm 88 through the bearings 94 and 92, respectively.

The action of the differential gearing mechanism can best be explained by referring to the motion of the turret 30 and the associated motion of the tuning lever 50 separately although actually occurring simultaneously when turret 30 is switched from one detent position to another. Taking the rotation of turret 30 alone, FIGURES 3 and 5 indicate that any rotation of the turret is transmitted by the crown gear 80 through the common differential gear 82 to the differential output gear 96. Assuming now that the turret 30 is set at a detent stop position and the appropiate tuning screw 48 is adjusted by the tuning preset mechanism 62, it can now be seen that the motion of the tuning screw is transmitted to the actuating lever arm 88 through the associated motion of the tuning lever arm 50 and the connecting rod 90. The force on the actuating lever arm 88 rotates the rotatable lever means 86 about the shaft 39, which in turn causes the common differential gear 82 to rotate about the shaft 84. Since the turret 30 is detented and therefore can not be easily rotated, the rotary motion of common differential gear 82 is transmitted to rotate the differential output gear 96. As a result, as turret 30 is switched from one detent position to the next, the rotation of the turret 30 and the movement of the tuning lever arm 50 are both coupled together simultaneously through the common differential gear 82 to rotate the differential output gear 96 to a desired setting.

A design advantage of the rotatable lever means 86 should be noted at this point. The mechanical advantage of the rotatable lever means 86 can be simply adjusted by changing the length of the actuating lever arm 88 and the length of the tuning screws 48 to suit the system requirement. No further changes in the mechanism need be made.

Fixed to the differential output gear 96 is a pinion gear 98, which also rotates about the shaft 39. The pinion gear 98 in turn meshes a tuner shaft pinion gear 100, permanently attached to the tuner shaft 28, in a step-down ratio (FIGURE 2). As a result, any rotation of the turret 30 and its associated movement of the tuning lever arm 50 is transmitted through the differential lever mechanism and gearing means in a step-down ratio to rotate the tuner shaft 28.

Also meshing with the tuner pinion gear 100, in opposition to the gear 96, is a spring biased anti-backlash gear assembly 102 mounted to rotate about a shaft 103 which extends between the mounting brackets 44 and 45. An anti-backlash spring 104 wound about the shaft 103 is preset with a fixed amount of tension and attached to mounting frame 44 at a point 106, while the other end 108 is attached to the anti-backlash gear assembly 102. As a result, the gear assembly 102 is spring torque biased through the spring 104 to urge against the gear 100 to remove any slack in the gearing system. In addition, since the anti-backlash gear assembly 102 is mounted to mesh with the gear 100 at a point approximtaely 180° away from the meshing of gears 98 and 100, the anti-backlash system also removes uneven lateral bearing pressure on the tuner shaft 28 due to the torques of the gearing system thereby enhancing the tuner resettability.

This tuning mechanism as described above provides an improved step-by-step UHF preset television tuner mechanism capable of tuning to any station in the UHF band. In the described mode of the invention, as many as twenty-four television channels can be preset and subsequently reselected by a step-by-step detent tuning action with accurate resettability to the selected television channel without further adjustment. Furthermore, the mechanism has been found to be resettable to within ±50 kc.

As a result, the step-by-step tuning mechanism is also capable of returning to a preset color television channel without any further adjustment.

Figure 1:
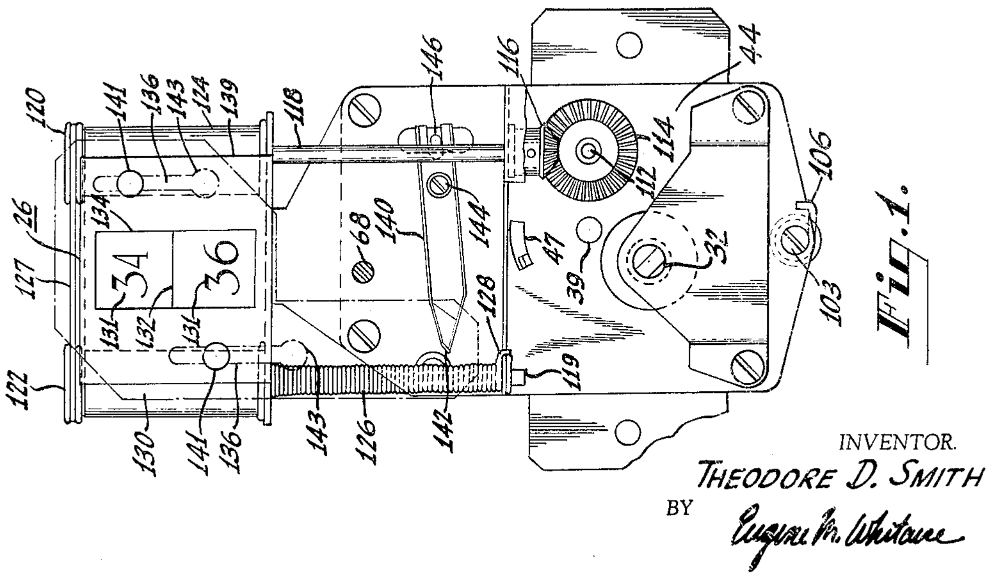
FIGURE 1 is a front view of the preset tuning mechanism for a UHF television tuner embodying the invention.

An indicator mechanism 26 is provided to indicate the channel setting of the tuner 20. The movement of the turret 30 is picked up through a pinion gear 110 which meshes with the turret input ring gear 36 as shown in FIGURE 4. The rotation of the pinion gear 110 is transmitted through a shaft 112 to a bevel gear 114 (FIGURES 1 and 2). The bevel gear 114, in turn, meshes with a second bevel gear 116 which drives the indicator assembly 26 through a shaft 118.

The indicator assembly 26 consists of two spools 120 and 122 about which a celluloid tape 124 is wound. The celluloid tape wound about the spools is a long strip of material upon which, at predetermined points, ultra high frequency channel numbers are imprinted. In the present example, each detent position of the turret 30 corresponds to a point at which three channels can be tuned to. As shown in FIGURE 1, the extreme two of the three channels 131 available at the particular detent position are shown as imprinted on a portion of the celluloid tape 124. The third channel (channel 35) lies midway between the two listed channels. However, if desired, all three channels can be imprinted.

The spool 120 is connected to the shaft 118 while the spool 122 is mounted to rotate about a shaft 119. The celluloid tape 124 is wound about the spool 120 and unwound from the spool 122, as the shaft 118 is turned clockwise as viewed from the bevel gear 116. The gear ratio and the spacing between the sets of channels marking on the celluloid film 124 is designated so a new set of channels markings are switched into a mid-position between the spools 121 and 120 as the rotary turret 30 is switched from one detent position to another. A spring 126, wound about the shaft 119, is connected at one end to the spool 122 while the other end is attached to the mounting bracket 44 at a point 128. The spring 126 is preset with a fixed amount of spring tension designed to keep the celluloid tape 124 taut between the spools 120 and 122. In addition, as the celluloid tape 124 is wound on the spool 120, the spool 122, while rotating in the process of unwinding its portion of the film, increases the spring tension in the spring 126. The added spring tension serves the purpose to rewind the celluloid tape back on the spool 122 from the spool 120 when the turret 30 calls for a counterclockwise rotation of the shaft 118. As before, the motion of the film 124 from the spool 120 to 122 is again synchronized with the rotation of the rotary turret from one detent position to the next. In addition, to the spring 126, an elastic band 127 is connected between the spools 120 and 122 to insure a uniform rotation between the spools.

Shown in phantom in FIGURE 1, as part of the indicator assembly 26, is a vertically movable indicator slide 130. The indicator slide 130 masks off all of the celluloid tape 124 except for the portion directly behind a window 134, thereby indicating only the channels available to be tuned to that particular detent position. Midway across the window 134 is a horizontal indicator line 132 used to denote which of the three available stations the tuner is tuned to at that particular detent.

The indicator slide 130 is loosely positioned on the indicator assembly 26 by a pair of slots 136 cut therein and a pair of pins 138 mounted on an indicator mounting bracket 139. As shown in FIGURE 1, the slots 136 contain enlarged holes 143 at the lower end. The pins 138 have narrow bodies with enlarged heads 141. The indicator slide 130 is mounted by passing the enlarged heads 141 of the pins 138 through the holes 143 and then held in position by sliding the indicator slide 130 down to a point where the enlarged heads 141 will be a greater diameter than the slots. At this point, it can be seen that the indicator slide 130 is free to move up and down within the extremes of narrow slots 136 without disengaging from pins 138. Note, as the indicator slide 130 is moved up and down, the tuning line 132 also moves up and down to indicate the desired one of the available three channels at the detent position.

The vertical positioning of the indicator slide 130 and the attached tuning indicator line 132 is dependent upon the positioning of the tuning lever arm 50 at the particular detent position. From FIGURES 1, 2, and 5, it can be seen that as the tuning screws 48 are adjusted to tune to the desired one of the available channels, the in and out motion of the screw results in rotating the lever 50 about its fulcrum 58, and thereby moves the attached shaft 146 in an arc about fulcrum 58. The vertical component of the motion of shaft 146 is transmitted to the indicator lever arm 140 causing the lever to rotate about its fulcrum 144. The indicator lever arm 140 is attached to the indicator slide 130 at a point 142 thereby raising or lowering the indicator slide 130 to set the tuning line 132 to the one of the three stations to which the tuner is tuned to at the particular detent position.

From the above description, it can be seen that once the channels are preset at each detent position, a subsequent rotation of the knob 22 to the same detent position will retune the tuner 20 to the preselected station, select the proper set of three channels to be displayed by the indicator assembly 26, and also reset the tuning line 132 to indicate the number of the preset channel.

The tuning mechanism as previously shown and described may be modified by substituting a planetary differential gearing mechanism for the differential mechanism as previously described. Two modifications are shown, one in FIGURE 6 and the other in FIGURE 7.

Figure 6:
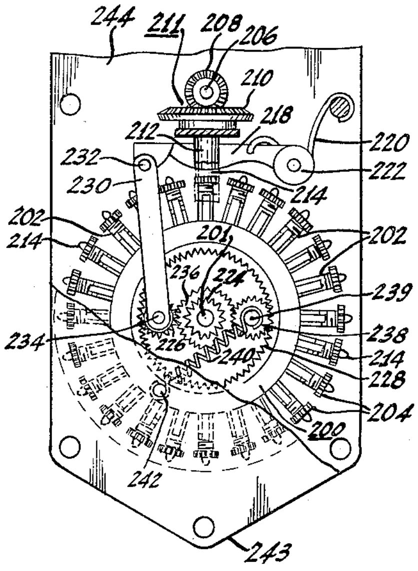
FIGURE 6 is a modification of the tuning mechanism shown in FIGURES 1–5, showing a planetary differential gearing system.

The operation of the modified version as shown in FIGURE 6 follows closely the operation of the mechanism shown in FIGURES 1 through 5 except for the substitution of a sun and planet type gearing arrangement to replace the rotatable lever means 86 and its associated gearing. In the modification in FIGURE 6, the rotary turret 200 rotates about a mounting shaft 201 and can be presumed to have a detent mechanism similar to that shown in FIGURE 4. The mounting shaft 201 extends between the mounting brackets 244 and 243. Turret 200 carries twenty-four equally spaced rotatable tuning adjustment screws 202 equally spaced and radially extending from the periphery thereof. The heads 204 of the tuning screws are also pinion gears which, when turned move the tuning screws in or out.

The tuning screws may be adjusted by the tuning preset assembly 62 as previously described or by the mechanism shown in FIGURE 6. The tuning screws are adjusted in FIGURE 6 by rotating a shaft 206 while at the same time applying a force to the shaft to move the entire tuning assembly 211 into tuning position. A force applied to the shaft 206 toward turret 200, as viewed in FIGURE 6, moves the tuning assembly 211 into tuning position by a meshing gear 212 with one of the positioned heads 204 of the tuning screws 202. Rotation of the shaft 206 will rotate the gear 212 through the bevel gears 208 and 210 and tune the screws 202 to desired position.

Each pinion gear head 204 carries as part of the tuning screw 202 a tip or cap 214. As the turret 200 is rotated, the tips 214 successively come into contact with a lever arm 218. The lever arm 218 is spring biased by a spring 220 against the tuning screw tips 214 as they rotate into position. As the tuning screws 202 are rotated in and out, the movement of the screw will pivot the lever 218 about its fulcrum 222.

The rotation of the turret 200 and the motion of the lever arm 218 is transmitted through a sun and planet differential type gearing to an output gear 224. As shown in FIGURE 6, a common differential planet gear 226 is coupled to a turret ring gear 228 and also to the lever 218 through the connecting rod 230 and its associated bearings 232 and 234. The planet gear 226 also meshes with a sun gear 236. The sun gear 236 is mounted to rotate about the mounting shaft 201 and is fixedly attached to the output gear 224.

As the turret 200 is rotated through its detent positions, its rotational motion is transmitted by the ring gear 228 through the common differential planet gear 234 to the sun gear 236, thereby rotating the output gear 224. In addition to the rotation of the turret 200, the movement of the lever arm 218 as it successively engages with the tuning screw tips 214 is also transmitted by the connecting rod 230 to the common differential planet gear 226, thereby rotatiing differential planet gear about the sun gear 236 which, in turn, again rotates the output gear 224. As a result, the final position of the output gear 224 is a function of the rotation of the turret to a given detent position and the setting of lever 218 at that particular detent position.

The output gear 224 is designed to mesh with the tuner gear 100 shown in FIGURES 2 and 3, transmitting the planetary differential gearing output to the tuner shaft 26 in a step-down ratio. The anti-backlash provisions previously mentioned including the anti-backlash gear assembly 102 and its associated anti-backlash spring 104 is also included to enhance resettability.

If desired, a second differential planet gear 238 can be included to mesh with the turret ring gear 228 and the sun gear 236 at a point approximately 180° away from the point where common differential planet gear 226 meshes with the same gears. An additional anti-backlash arrangement can now be included by connecting a spring 240 at one end to a pin 242 on the mounting bracket 243 and extending toward the turret 200 and connecting the other end of the spring 240 to a pin 239 about which differential planetary gear 238 rotates. The spring tension on the gear 238 through the pin 242 provides a means to take up the gear slack and backlash in the gearing system plus removes unequal lateral bearing pressure on the mounting shaft 201 by the common differential planet gear 226 thereby improving resettability.

Figure 7:
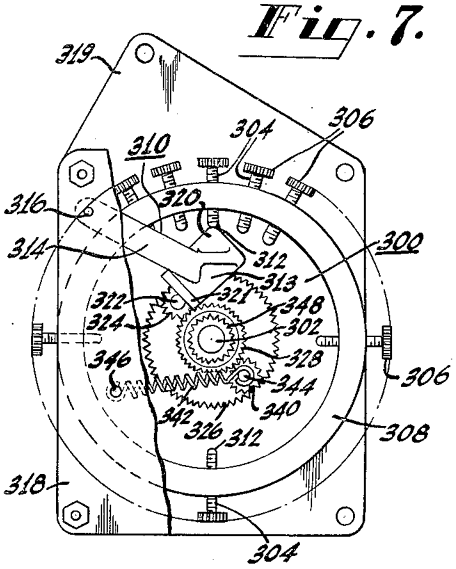
FIGURE 7 is a further modification of the tuning mechanism as shown in FIGURES 1–5, showing a planetary differential gearing system.

The second modification is shown in FIGURE 7. Here, a rotary turret 300 is mounted to rotate about a mounting shaft 302. The mounting shaft 302 extends between the mounting brackets 318 and 319. The turret 300 can be presumed to have a detent mechanism as shown in FIGURE 4. The turret 300 also carries twenty-four equally spaced adjustable tuning screws 304 in a row about the periphery thereof. The heads of the tuning screws 304 are pinion gears 306 which, when turned, move the screws 304 in and out. The screws 304 can be adjusted as previously described by the preset tuning assembly 62 in FIGURES 2, 3 and 5 or by the means shown in FIGURE 6.

The tuning screws 304 project through a turret ring 308 to make contact with a follower means 310. The follower means 310 comprises a rectangular head 313 mounted on an arm 314 which, in turn, is fastened to rotate about a fulcrum pin 316. The fulcrum pin 316, in turn, is fastened to the mounting bracket 318 and extends inwardly toward the turret 300. As the turret 300 is rotated, the tips 312 of the tuning screws 304 successively come into contact with corner 320 on follower head 313. As corner 320 makes contact with the tuning screws, side 321 of the follower head 313 bears on a planet gear shaft 322. The shaft 322 projects into a common differential planet gear 324 forming a movable bearing about which the common differential planet gear 324 can rotate and also extends beyond the gear outward away from the turret 300 toward the mounting bracket 318 to receive the thrust of the follower head 313. As shown in FIGURE 7, the common differential planet gear 324 meshes with the turret ring gear 326 and also the sun gear 328.

Also meshing with the sun gear 328 and the ring gear 326, but at a point approximately 180° away from point where the common differential planet gear 324 meshes with the same gears, is the spring-biased differential planet gear 340. The differential planet gear 340 is spring-biased by a spring 342 attached at one end to reference pin 346. The shaft 344, similar to shaft 322, projects into the differential planet gear 340 forming a movable bearing about which the gear can rotate, and also extends beyond the gear outward away from the turret 300 toward the mounting bracket 318, thereby providing a means to attach the spring 342. Reference pin 346 is affixed to the mounting bracket 318, extending perpendicular to the mounting bracket toward the turret 300. The tension of the spring 342 is transmitted through the sun and planet differential gearing to the common differential planet gear 324. The planet gear pin 322, in turn, acts upon the follower head 313 causing it to bear against the tuning screws 304 as they rotate into position. In addition to the spring bias provided by spring 342, the combination also provides a means of taking up the gear slack and backlash of the system, and in addition reducing unequal lateral bearing pressure on shaft 302 by the common differential planet gear 324 thereby improving resettability.

The follower means 310 is designed to rotate about the pin 316, the amount of rotation being dependent upon the setting of the tuning screws 304. As the follower means 310 rotates, the associated pressure by the side 321 on the pin 322 causes the differential planet gear 324 to rotate the sun gear 328. Permanently attached to the sun gear 328 is an output gear 348.

As the turret 300 is rotated through its detent positions, the rotational motion is transmitted by the ring gear 326 through the planet gears 324 and 340 to the sun gear 328, thereby rotating the output gear 348. In addition to the rotation of the turret, the movement of the follower means 310, as it successively engages with the tuning screw 304 is also transmitted by the common differential planet gear 324 to the sun gear 328 thereby also rotating the output gear 348. As a result the final position of the output gear 348 will be a function of the rotation of the turret and the follower means 310 setting at the particular detent position.

The output gear 348 will mesh with the tuner gear 100 shown in FIGURES 2 and 3 transmitting the rotation of the planeting differential gearing output to the tuner shaft 28 in a step-down ratio.

It should be noted that as the last described modification is adapted to rotate the tuner shaft 28, the previously described anti-backlash gear assembly 102 and its associated spring 104 can also be included in the combined mechanism to further enhance the tuner resettability.

It should be noted that in both the above-mentioned sun and planet differential gearing modifications, the shafts about which the common planet gears rotate (234 and 239 in FIGURE 6 and 322 and 344 in FIGURE 7) are mounted on a carrier plate. The carrier plate (not shown) is located behind the turret ring gear as viewed in FIGURES 6 and 7 and mounted to rotate about the respective mounting shaft (201 in FIGURE 6 and 302 in FIGURE 7). This will provide a common rotatable base between the common planet gear shafts in each modification. The antibacklash spring (240 FIGURE 6 and 342 FIGURE 7) can thereby assert its force upon both common planet gear shafts through the carrier plate as well as through the connected gearing thereby enchancing the turner resettability.

What is claimed is:

1. A tuning mechanism comprising in combination:
- a tuner including a rotatable control shaft to tune said tuner over a range of frequencies;
- a rotary turret having a plurality of adjustable control elements;
- lever means positioned for engagement with successive ones of said adjustable control elements;
- first coupling means connected to said tuner control shaft;
- second coupling means coupling said lever means to said first coupling means;
- third coupling means coupling said turret to said first coupling means wherein said turret rotates said tuner control shaft over consecutive portions of the frequency range of said tuner and said lever means rotates said tuner control shaft over at least the range of frequencies covered by each consecutive portion of the tuner frequency range;
- means for effecting adjustment of said adjustable control elements; and
- means for rotating said turret to bring said successive ones of said control elements into engagement with said lever means.

2. A tuning mechanism comprising in combination:
- a tuner including a rotatable control shaft;
- a rotary turret having a plurality of adjustable control elements;
- lever means positioned for engagement with said successive ones of said adjustable control elements;
- differential gearing means including an input gear, an output gear and a differential gear;
- means coupling the input gear to said turret;
- means coupling the output gear to said tuner control shaft;
- means coupling the differential gear to said lever means;
- means for effecting adjusting of said adjustable control elements; and
- means for rotating said turret for bringing said successive ones of said control elements into engagement with said lever means.

3. A tuning mechanism comprising in combination:
- a tuner including a rotatable control shaft;
- a rotary turret having a plurality of adjustable control elements;
- lever means positioned for engagement with said successive ones of said adjustable control elements;
- differential gearing means including an input gear, an output gear and a differential gear;
- means coupling the input gear to said turret;
- means coupling the output gear to said tuner control shaft;
- means coupling the differential gear to said lever means;
- means for effecting adjustment of said adjustable control elements;
- means for rotating said turret for biasing said successive ones of said control elements into engagement with said lever means; and
- a torque type spring biased gear coupled to said coupling means between said output gear and said tuner control shaft.

4. A television tuning mecahnism comprising in combination:
- a television tuner including a rotatable control shaft to tune said tuner over the television band of frequencies;
- a rotary turret having a plurality of adjustable control elements;
- detent means coupled with said rotary turret for providing a plurality of detent stop positions for said turret corresponding to the number of adjustable control elements;
- lever means positioned for engagement with said successive ones of said adjustable control elements at each detent stop position;
- first coupling means connected to said tuner control shaft;
- second coupling means coupling said lever means to said first coupling means;
- a third coupling means coupling said turret to said first coupling means wherein said turret rotates said tuner control shaft over consecutive portions of the frequency range of said tuner in a step-by-step manner said said lever means rotates said tuner shaft over at least the range of frequencies covered by each stop position;
- means for effecting adjustment of said adjustable control elements; and
- means for rotating said turret through the plurality of detent positions to bring successive ones of said control elements into engagement with said lever means.

5. A television tuning mechanism comprising in combination:
- a television tuner including a rotatable control shaft;
- a rotary turret having a plurality of adjustable control elements;
- detent means coupled with said rotary turret for providing a plurality of detent stop positions corresponding to the number of adjustable control elements;
- lever means positioned for engagement with said successive ones of said adjustable control elements at each detent stop position;
- coupling means coupling said lever means and said turret to said tuner control shaft wherein said lever means and said turret act together upon said coupling means to rotate said control shaft;
- means for effecting adjustment of said adjustable control elements;
- means for rotating said turret through the plurality of detent positions to bring successive ones of said control elements into engagement with said lever means; and
- means coupling said lever means to said detent means so that said detent means disengages said lever means from engagement with said adjustable control elements as said detent means is rotated between the plurality of detent positions.

6. A television tuning mechanism comprising in combination;
- a television tuner including a rotatable control shaft;
- a rotary turret having a plurality of adjustable control elements;
- detent means coupled with said rotary turret for providing a plurality of detent stop positions corresponding to the number of adjustable control elements;
- lever means positioned for engagement with said successive ones of said adjustable control elements at each detent stop position;
- differential gearing means including an input gear coupled to said turret, an output gear coupled to said tuner control shaft and a differential gear meshing with said output gear and said input gear, said differential gear being coupled to said lever means, whereby said turret and said lever means act together upon said differential gearing means to rotate said tuner control shaft;

means for effecting adjustment of said adjustable control elements; and means for rotating said turret through the plurality of detent positions to bring successive ones of said control elements into engagement with said lever means.

7. A television tuning mechanism comprising in combination:

a television tuner including a rotatable control shaft;

a rotary turret having a plurality of adjustable control elements;

detent means coupled with said rotary turret for providing a plurality of detent stop positions corresponding to the number of adjustable control elements;

lever means positioned for engagement with said successive ones of said adjustable control elements at each detent stop position;

differential gearing means including an input gear coupled to said turret, an output gear coupled to said tuner control shaft and a differential gear meshing with said output gear and said input gear, said differential gear being coupled to said lever means, whereby said turret and said lever means act together upon said differential gearing means to rotate said tuner control shaft;

means for effecting adjustment of said adjustable control elements;

means for rotating said turret through the plurality of detent positions to bring successive ones of said control elements into engagement with said lever means; and means coupling said lever means to said detent means to disengage said lever means from engagement with said adjustable control elements as said detent means is rotated between said plurality of detent positions.

8. A television tuning mechanism comprising in combination:

a television tuner including a rotatable control shaft;

a rotary turret having a plurality of adjustable control elements;

detent means coupled with said rotary turret for providing a plurality of detent stop positions corresponding to the number of adjustable control elements;

lever means positioned for engagement with said successive ones of said adjustable control elements at each detent stop position;

planetary differential gearing means including a ring gear coupled to said turret, a sun gear coupled to said tuner control shaft and a differential planet gear meshing with said ring gear and sun gear, said differential planet gear being coupled to said lever means, whereby said turret and said lever means act together upon said planetary differential gearing means to rotate said tuner control shaft;

means for effecting adjustment of said adjustable control elements; and means for rotating said turret through the plurality of detent positions to bring successive ones of said control elements into engagement with said lever means.

9. A television tuning mechanism comprising in combination:

a television tuner including a rotatable control shaft;

a rotary turret having a plurality of adjustable control elements;

detent means coupled with said rotary turret for providing a plurality of detent stop positions corresponding to the number of adjustable control elements;

lever means positioned for engagement with said successive ones of said adjustable control elements at each detent stop position;

planetary differential gearing means including a ring gear coupled to said turret, a sun gear coupled to said tuner control shaft, and a plurality of differential planet gears meshing with said ring gear and said sun gear, one of said differential planet gears being coupled to said lever means, whereby said turret and said lever means act together upon said planetary differential gearing means to rotate said tuner control shaft;

means spring biasing other ones of said plurality of said differential planet gears to urge against said sun gear to enhance the tuner control shaft resettability;

means for effecting adjustment of said adjustable control elements; and means for rotating said turret through the plurality of detent positions to bring successive ones of said control elements into engagement with said lever means.

10. A television tuning mechanism comprising in combination:

a television tuner including a rotatable control shaft;

a rotary turret having a plurality of adjustable control elements;

detent means coupled with said rotary turret for providing a plurality of detent stop positions for said turret corresponding to the number of adjustable control elements;

lever means positioned for engagement with said successive ones of said adjustable control elements at each detent stop position;

first coupling means connected to said tuner control shaft;

second coupling means coupling said lever means to said first coupling means;

third coupling means coupling said turret to said first coupling means wherein said turret rotates said tuner control shaft over consecutive portions of the frequency range of said tuner in a step-by-step manner and said lever means rotates said tuner control shaft over the range of frequencies covered by each stop position;

a torque type spring biased anti-backlash gearing means coupled to said first coupling means;

means for effecting adjustment of said adjustable control elements; and means for rotating said turret through the plurality of detent positions to bring successive ones of said control elements into engagement with said lever means.

11. A television tuning mechanism comprising in combination:

a television tuner including a rotatable control shaft;

a rotary turret having a plurality of adjustable control elements;

detent means coupled with said rotary turret for providing a plurality of detent stop positions corresponding to the number of adjustable control elements;

lever means positioned for engagement with said successive ones of said adjustable control elements at each detent stop position;

coupling means coupling said lever means and said turret to said tuner control shaft wherein said lever means and said turret act together upon said coupling means to rotate said control shaft;

a torque type spring biased anti-backlash gearing means coupled to said coupling means;

means for effecting adjustment of said adjustable control elements;

means for rotating said turret through the plurality of detent positions to bring successive ones of said control elements into engagement with said lever means; and means coupling said lever means to said detent means to disengage said lever means from engagement with said adjustable control elements as said detent means is rotated between said plurality of detent positions.

12. A television tuning mechanism comprising in combination:

a television tuner including a rotatable control shaft with a gear attached thereto;

a rotary turret having a plurality of adjustable control elements;

detent means coupled to said turret providing a plurality of detent stop positions for said turret corresponding to the number of adjustable control elements;

lever means positioned for engagement with a different one of said adjustable control elements at each of said detent stop positions;

a differential gearing means including an input gear, differential gear and an output gear, said input gear being coupled to said turret, said output gear being coupled to said tuner control shaft gear in a step down gear ratio and said differential gear being coupled to said lever means, wherein said lever and said turret means act together upon said differential gearing means to rotate the control shaft;

a spring biased gear coupled to urge against said tuner control shaft gear at a point approximately 180° from the coupling connection between said output gear gearing and said tuner control shaft gear;

means for effecting adjustment of said adjustable control means; and means for rotating said turret through the plurality of detent positions to bring successive ones of said control elements into engagement with said lever means.

13. A television tuning mechanism comprising in combination:

a television tuner including a rotatable control shaft with a gear attached thereto;

a rotary turret having a plurality of adjustable control elements;

detent means coupled with said rotary turret for providing a plurality of detent stop positions corresponding to the number of adjustable control elements;

lever means positioned for engagement with said successive ones of said adjustable control elements at each detent stop position;

differential gearing means including an input gear coupled to said turret, an output gear meshing with said tuner control shaft gear and a differential gear meshing with said output gear and said input gear, said differential gear being coupled to said lever means, whereby the motion of said turret and the motion of said lever means is coupled through said differential gearing means to rotate said tuner control shaft;

a spring biased gear coupled to urge against said tuner control shaft gear at a point approximately opposite to the point where said output gear gearing meshes with said tuner control shaft gear, said spring bias producing a torque type bias;

means for effecting adjustment of said adjustable control elements; and means for rotating said turret through the plurality of detent positions to bring successive ones of said control elements into engagement with said lever means.

14. A preset tuning mechanism for ultra high frequency television tuners comprising:

an ultra high frequency tuner with a rotatable tuning control shaft extending therefrom, said tuner being continuously tunable over the ultra high frequency range;

a rotary turret including a plurality of adjustable tuning control elements equally spaced about the periphery thereof, the number of adjustable tuning control elements being less than half the total number of ultra high frequency television channels;

detent means for providing a plurality of equally spaced detent stop positions coupled to said turret, the number of stop positions corresponding to the number of said adjustable control elements;

differential gearing means including an input gear, an output gear and a differential gear wherein said input gear is connected to said turret with teeth aimed perpendicular to the plane of rotation of said turret, step down gearing means for coupling said output gear to said tuner shaft, the teeth of said output gear being aimed towards said input gear teeth, said differential gear being coupled to mesh with said input gear and output gear, said differential gear also being mounted on a rotatable lever arm;

a lever means spring biased to a position for successive engagement by one of said plurality of said adjustable tuning control elements, said lever means being coupled to said rotatable lever arm to rotate said tuner control shaft through said differential gearing means and said step down gearing means, the motion of said lever means tuning said tuner to the desired one of said channels in each of said detent stop positions depending upon the adjustment of said adjustable control elements;

a spring biased gear coupled to rotatively urge against said step down gearing means between said output gear and said tuner control shaft;

means for effecting adjustment of said adjustable control elements; and means for rotating said turret through the plurality of detent positions to bring successive ones of said control elements into engagement with said lever means.

15. A turning mechanism for ultra high frequency television tuners comprising in combination:

an ultra high frequency television tuner including an adjustable control shaft for continuously tuning said tuner through the ultra high frequency band;

detent means providing a plurality of stop positions, the number of stop positions being significantly less than the number of ultra high frequency channels;

means for moving said detent means through said plurality of stop positions;

first coupling means connected to said tuner control shaft;

a second coupling means coupling said detent means to said first coupling means for adjusting said control shaft over consecutive portions of the ultra high frequency band in a step-by-step manner whereby a plurality of television channels are covered by each detent stop position;

preset tuning means;

and third coupling means coupling said preset tuning means to said first coupling means for adjusting said tuner control shaft in each of said stop positions to tune said tuner to a desired one of said plurality of channels covered by each of said stop positions.

16. A tuning mechanism for ultra high frequency television tuners comprising in combination:

an ultra high frequency television tuner including an adjustable control shaft for continuously tuning said tuner through the ultra high frequency band;

a turret including a plurality of adjustable control elements, the number of adjustable control elements being significantly less than the number of ultra high frequency channels;

detent means providing a plurality of stop positions corresponding to the number of adjustable control elements;

means for moving said turret through said plurality of stop positions;

coupling means coupling said detent means to said turret;

tuning means coupled for engagement with successive ones of said adjustable control elements;

means coupling said tuning means to said coupling means coupling said detent means to said tuner control shaft for adjusting said tuner control shaft in each of said stop positions to tune said tuner to a desired one of said plurality of channels covered by each said stop position depending upon the adjustment of the corresponding adjustable control element; and means coupling said tuning means to said detent menas to uncouple said preset tuning means from engagement with said adjustable control elements as said detent means is switched from one detent stop position to the next.

17. A tuning mechanism for ultra high frequency television tuners comprising in combination:

an ultra high frequency television tuner including an adjustable control shaft for continuously tuning said tuner through the ultra high frequency band;

detent means providing a plurality of stop positions, the number of stop positions being significantly less than the number of ultra high frequency channels;

means for positioning said detent means through said plurality of stop positions;

coupling means coupling said detent means to said tuner shaft to select one of a group of television channels at each detent stop position;

tuning means coupled to said coupling means for adjusting said tuner control shaft in each of said stop positions;

preset means coupled to said tuning means to tune said tuner to a desired one of said plurality of channels covered by each of said stop positions; and means coupling said tuning means to said detent means to uncouple said tuning means from said preset tuning means as said detent means is switched from one detent position to the next.

18. A preset tuning mechanism for ultra high frequency television tuners comprising:

an ultra high frequency tuner with a rotatable tuning control shaft extending therefrom, said tuner being continuously tunable over the ultra high frequency band;

a rotary turret including a plurality of adjustable tuning control elements equally spaced about the periphery thereof, the number of adjustable tuning control elements being significantly less than the number of channels in said television band;

detent means coupled to said turret providing a plurality of stop positions for said turret corresponding to the number of adjustable tuning control elements;

a spring biased lever positioned for engagement by successive ones of said adjustable control elements at each detent stop position;

first coupling means connected to said tuner control shaft;

second coupling means coupling said lever means to said first coupling means;

third coupling means coupling said turret to said first coupling means wherein said turret rotates said tuner control shaft over a range of frequencies covering successive groups of television channels in a step-by-step manner, and said lever means rotates said tuner control shaft over at least the range of frequencies covered by each stop position;

anti-backlash torque type spring bias means coupled to said first coupling means;

means for effecting adjustment of said adjustable control elements; and means for rotating said turret through the plurality of detent positions to bring successive ones of said control elements into engagement with said lever means.

19. A preset tuning mechanism for ultra high frequency television tuners comprisng:

an ultra high frequency tuner with a rotatable tuning control shaft with a gear attached thereto, said tuner being continuously tunable over the ultra high frequency range;

a rotary turret including a plurality of adjustable tuning control elements equally spaced about the periphery thereof, the number of adjustable tuning control elements being less than half the total number of ultra high frequency television channels;

detent means coupled to said turret for providing a plurality of equally spaced detent stop positions for said turret, the number of stop positions corresponding to the number of said adjustable control elements;

means coupled to said turret for driving said turret through the plurality of detent stop positions;

differential gearing means including an input gear, an output gear and a common differential gear wherein said input gear is connected to said turret with teeth aimed perpendicular to the plane of rotation of said turret, said output gear meshing with said tuner control shaft gear in a step down speed ratio, said output gear having teeth aimed towards said input gear teeth, said common differential gear being coupled to mesh with both said input gear and said output gear, said differential gear also being mounted on a rotatable lever arm;

a lever means spring biased to a position for successive engagement by one of said plurality of said adjustable tuning control elements, said lever means being coupled to said rotatable lever arm to rotate said tuner control shaft through said differential gearing means and said tuner control shaft gear, whereby the motion of said lever means tunes said tuner to the desired one of said channels in each of said detent stop positions depending upon the adjustment of said adjustable control elements;

a spring biased gear coupled to urge against said tuner control shaft gear at a point approximately opposite to the point where said output gear meshes with said tuner control shaft gear, said spring bias producing a torque type bias acting on said tuner control shaft gear;

means for effecting adjustment of said adjustable control eleemnts; and means for rotating said turret through the plurality of detent positions to bring successive ones of said control elements into engagement with said lever means.

20. A preset tuning mechanism for ultra high frequency television tuners comprising:

an ultra high frequency tuner with a rotatable tuning control shaft with a gear attached thereto, said tuner being continuously tunable over the ultra high frequency range;

a rotary turret including a plurality of adjustable tuning control elements equally spaced about the periphery thereof, the number of adjustable tuning control elements being less than half the total number of ultra high frequency television channels;

detent means for providing a plurality of equally spaced detent stop positions coupled to said turret, the number of stop positions corresponding to the number of said adjustable control elements;

differential gearing means including an input gear, an output gear and a common differential gear wherein said input gear is connected to said turret with teeth aimed perpendicular to the plane of rotation of said turret, means for coupling said output gear to said tuner control shaft gear in a step-down speed ratio, said output gear having teeth aimed towards said input gear teeth, said common differential gear being coupled to mesh with both said input gear and said output gear, said differential gear also being mounted on a rotatable lever arm;

a lever means spring-biased to a position for successive engagement by one of said plurality of said adjustable tuning control elements, said lever means being coupled to said rotatable lever arm to rotate said tuner control shaft through said differential gearing means and said coupling means, whereby the motion of said lever means tunes said tuner to the desired one of said channels in each of said detent stop positions depending upon the adjustment of said adjustable control elements;

a spring-biased gear coupled to urge against said tuner control shaft gear at a point approximately opposite to the point where said output gear coupling means meshes with said tuner control shaft gear, said spring bias producing a torque type bias acting on said tuner control shaft gear;

means for effecting adjustment of said adjustable control elements;

means for rotating said turret through the plurality of detent positions to bring successive ones of said control elements into engagement with said lever means; and means coupling said lever means to said detent means to move said lever means out of the path of said adjustable control elements as said detent means is rotated from one detent position to the next.

21. A television mechanism comprising in combination:

a television tuner including a rotatable control shaft for tuning through the frequency range of said tuner;

a rotary turret having a plurality of control elements;

detent means coupled to said rotary turret for providing a plurality of detent stop positions corresponding to the number of control elements;

lever means positioned for engagement with said successive ones of said control elements at each detent stop positions;

a first coupling means connected to said tuner control shaft;

a second coupling means coupling said lever means to said first coupling means;

third coupling means coupling said turret to said first coupling means wherein said turret rotates said tuner control shaft over consecutive portions of said tuner frequency range in a step-by-step manner and said lever means rotates said tuner control shaft over the range of frequencies covered by each detent stop position of said turret; and means for rotating said turret through the plurality of detent positions to bring successive ones of said control elements into engagement with said lever means.

References Cited by the Examiner

UNITED STATES PATENTS

| | | | |
|---|---|---|---|
| 2,066,246 | 12/36 | Bolton | 74—10.15 X |
| 2,236,309 | 3/41 | Dahlstrom | 74—10.15 |
| 2,513,217 | 6/50 | Tomlines | 74—409 |
| 2,959,975 | 11/60 | Lingel | 74—409 |

FOREIGN PATENTS

| | | |
|---|---|---|
| 484,297 | 6/52 | Canada. |

BROUGHTON G. DURHAM, *Primary Examiner.*

MILTON KAUFMAN, *Examiner.*